United States Patent [19]
Wang et al.

[11] Patent Number: 5,357,119
[45] Date of Patent: Oct. 18, 1994

[54] FIELD EFFECT DEVICES HAVING SHORT PERIOD SUPERLATTICE STRUCTURES USING SI AND GE

[75] Inventors: Kang L. Wang, Santa Monica; Jin S. Park, Gardena, both of Calif.

[73] Assignee: Board of Regents of the University of California, Oakland, Calif.

[21] Appl. No.: 19,719

[22] Filed: Feb. 19, 1993

[51] Int. Cl.$^5$ .............................................. H01L 27/12
[52] U.S. Cl. ......................................... 257/18; 257/19; 257/24; 257/192; 257/194; 257/20
[58] Field of Search ...................... 257/24, 18, 19, 192, 257/194, 195, 20

[56] References Cited

U.S. PATENT DOCUMENTS

| | | | |
|---|---|---|---|
| 4,661,829 | 4/1987 | Bean et al. | 257/19 X |
| 4,710,788 | 12/1987 | Dämbkes et al. | 257/194 |
| 4,771,326 | 9/1988 | Curran | 257/19 X |
| 4,959,694 | 9/1990 | Gell | 257/19 X |
| 5,031,007 | 7/1991 | Chaffin et al. | 257/192 X |
| 5,155,571 | 10/1992 | Wang et al. | 257/19 |
| 5,223,724 | 3/1992 | Green, Jr. | 257/24 X |
| 5,241,197 | 8/1993 | Murakami et al. | 257/192 |
| 5,241,214 | 8/1993 | Herbots et al. | 257/192 X |

FOREIGN PATENT DOCUMENTS

| | | | |
|---|---|---|---|
| 3227070 | 10/1991 | Japan | 257/24 |
| 8901704 | 2/1989 | PCT Int'l Appl. | 257/24 |

OTHER PUBLICATIONS

Ismail et al. "High–Transconductance N–Type Si/SiGe Modulation–Doped Field–Effect Transistors," IEEE Electron Device Letters, vol. 13, No. 5, May 1992, pp. 229–231.

Wegscheider et al., "Novel Relaxation Process in Strained Si/Ge Superlattices Grown on Ge(001)," Appl. Phys. Lett. 57(15), 8 Oct. 1990, pp. 1496–1498.

Satpathy et al., "Electronic Properties of the (100)(Si)/(Ge) Strained–Layer Superlattices," Physical Review B, vol. 38, No. 18, 15 Dec. 1988–II, pp. 237–245.

No Author, "Optimal Growth Technique and Structure for Strain Relaxation of Si–Ge Layers on Si Substrates," IBM Technical Disclosure Bulletin, vol. 32, No. 8A, Jan. 1990, pp. 330–331.

Rensch et al., "Performance of the Focused–Ion–Striped Transistor (FIST)–A New MESFET Structure Produced by Focused–Ion–Beam Implantation," IEEE Transactions on Electron Devices, vol. ED–34, No. 11, Nov. 1987, pp. 2232–2237.

No Author, "Strained Si/Ge Superlattice for Optical Modulation at 1.3 $\mu$m," IBM Technical Disclosure Bulletin vol. 32, No. 108, Mar. 1990, pp. 259–260.

Iyer, et al., "Heterojunction Bipolar Transistors Using Si–Ge Alloys," IEEE Trans. on Electron Devices, vol. 36, No. 10, Oct. 1989, pp. 2043–2064.

Nayak, et al., "Enhancement–Mode Quantum–Well $Ge_x Si_{1-x}$ PMOS," IEEE Electron Device Letters, vol. 12, No. 4, Apr. 1991, pp. 154–156.

Canham, "Silicon Quantum Wire Array Fabrication By Electrochemical and Chemical Dissolution of Wafers," App. Phys. Lett. vol. 57, No. 10, 3 Sep. 1990, pp. 1046–1048.

People, "Physics and Applications of $Ge_x Si_{1-x}$/Si Strained Layer Heterostructures," IEEE J. of Quantum Electronics, vol. QE–22, No. 9, Sep. 1986, pp. 1696–1710.

Primary Examiner—William Mintel
Attorney, Agent, or Firm—Townsend and Townsend Khourie and Crew

[57] ABSTRACT

Carrier mobility in a heterojunction field effect device is increased by reducing or eliminating alloy scattering. The active channel region of the field effect device uses alternating layers of pure silicon and germanium which form a short period superlattice with the thickness of each layer in the superlattice being no greater than the critical thickness for maintaining a strained heterojunction. The gate contact of the field effect device can comprise quantum Si/Ge wires which provide quantum confinement in the growth plane, thereby allowing the field effect device to further improve the mobility by restricting phonon scattering. The structure can be used to improve device speed performance.

20 Claims, 2 Drawing Sheets

FIELD EFFECT DEVICES HAVING SHORT PERIOD SUPERLATTICE STRUCTURES USING SI AND GE

BACKGROUND OF THE INVENTION

This invention relates generally to field effect semiconductor devices having strained heterojunction structures, and more particularly the invention relates to strained heterojunction field effect devices which have improved carrier mobility.

Electrical and optical silicon devices are known which use silicon-germanium alloy superlattice heterostructures and heterojunctions. A major advantage of the $Si_{1-x}Ge_x$/Si devices lies in the fabrication compatibility with semiconductor integrated circuit technology. With the advent of molecular beam epitaxy (MBE) and low temperature chemical vapor deposition (CVD) techniques, high quality $Si_{1-x}Ge_x$/Si heterostructures or superlattices can be easily obtained. Recently, heterojunction bipolar transistors using the $Si_{1-x}Ge_x$/Si strained layers have demonstrated potential applications in high speed circuits. See, for example, Plummer and Taft, U.S. Pat. No. 4,825,269 and Iyer, et al. "Heterojunction Bipolar Transistors Using Si/Ge Alloys" *IEEE Transactions on Electron Devices*, Vol 36 No. 10, October 1989, pp. 2033-2064. Cutoff frequency of above 75 GHZ has been reported. Furthermore, strained $Si_{1-x}Ge_x$/Si quantum well P-channel MOSFETS have been demonstrated using the enhancement and transconductance ($g_m$) due to the high mobility of the strained silicon-germanium alloy layer. See Nayak et al. "Enhancement Mode Quantum Well $Ge_xSi_{1-x}$ PMOS", *IEEE Electron Device Letters*, Vol. 12 No. 4, April 1991, pp. 154-156. The transconductance ($g_m$) is shown to be about twice that of the conventional p-doped silicon MOSFET with the same dimension.

A major advantage in using strained $Si_{1-x}Ge_x$/Si MOSFETS is improved carrier mobility in the channel by proper control of strain for increasing germanium concentration. However, the mobility enhancement of strained Si/Ge layers for both electrons and holes has a limiting factor. Mobility in semiconductors is in part governed by scatterings due to phonon, impurity or alloy. The dominant scattering mechanism for silicon-germanium alloys lies in the scattering due to the random mixture of silicon and germanium atoms.

The present invention is directed to increasing carrier mobility by reducing scattering in germanium-silicon superlattice structures.

SUMMARY OF THE INVENTION

In accordance with the invention, alloy scattering is reduced in superlattice structures of field effect semiconductor devices through use of pure silicon and/or germanium layers in a short period Si/Ge superlattice for the active channels of the devices. The short period Si/Ge superlattice can be used also in modulation doped field effect transistors (MODFET) or in high mobility electron transistors (HEMT) using modulation doping and in complementary structures.

In another application, the short period Si/Ge superlattice can be employed in optical electronic semiconductor devices. Through use of quantum wires, one-dimensional quantum confinement can be achieved.

The invention and objects and features thereof will be more readily apparent from the following detailed description and appended claims when taken with the drawing.

DETAILED DESCRIPTION OF ILLUSTRATED EMBODIMENTS

Figure 1A:
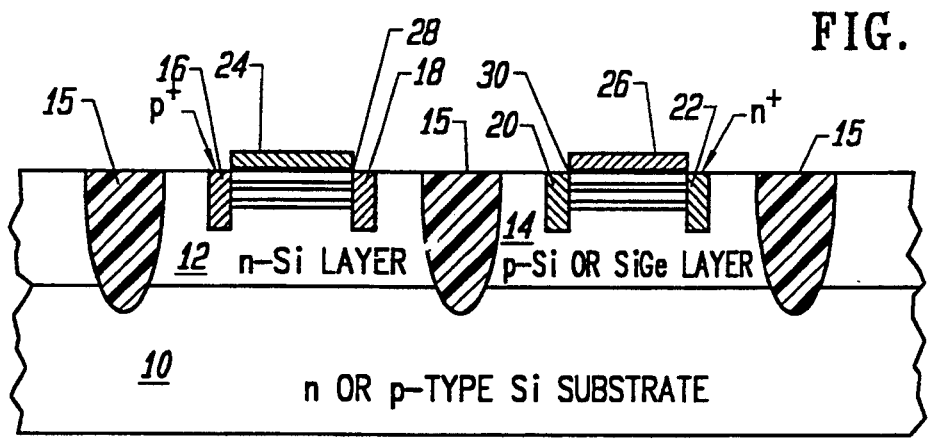
FIG. 1A is a section view of a superlattice CMOS structure in accordance with one embodiment of the invention.
Figure 1B:
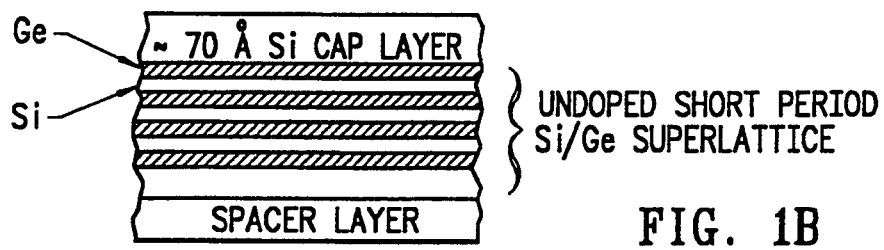
FIG. 1B is an enlarged cross section of the channel regions of the transistors in the structure.

Referring now the drawing, FIG. 1A is a section view of a superlattice CMOS transistor structure in accordance with the invention, and FIG. 1B is an enlarged section view of the channel regions of the structure. The device is fabricated on a monocrystalline silicon substrate 10 which can be doped either n-type or p-type. The p-channel device is fabricated in an n-doped silicon epitaxial layer 12, and the n-channel device is fabricated in a p-doped silicon or silicon-germanium alloy layer 14. Device isolation is provided by silicon oxide 15 which surrounds each device and extends through the epitaxial layers 12 and 14. P-doped source and drain regions 16 and 18 are formed in the n-silicon layer 12, and n+ doped source and drain regions 20 and 22 are formed in the layer 14. Gates 24 and 26 of metal or doped polycrystalline silicon are formed over the channel regions between the source and drain regions of the two transistors with an insulation layer such as silicon oxide 28 and 30 separating the gates and the underlying semiconductor material.

In accordance with the invention, the channel regions of the two field effect transistors comprise alternating layers of pure germanium and pure silicon as illustrated in the section view of FIG. 1B. Each of the Si and Ge layers consists of n and m atomic layers, or is approximately 2.83 n and 2.83 m Å thick, respectively. The superlattice may have a period of p, depending on respectively specific device applications. In other words, the total thickness of the superlattice is 2.83 p(m+n) Å. In a period, the maximum numbers of n atomic layers of Si and m atomic layer of Ge are limited by the respective critical thickness. The latter is determined by the strain or the underlying $Si_{1-x}Ge_x$ buffer layer. The period of the superlattice, however, is not limited if the strain is symmetrized. Or, in other words, when x is chosen such that x=n/(n+m). Shown on the left of FIG. 1A is the Si epitaxial buffer layer 12, but for strain symmetrization, a buffer layer of $Si_{-x}Ge_x$ with a chosen x may be grown, instead of pure Si, on top of Si substrate similarly to the buffer layer 14 shown on the right. For reference of the critical thickness see, for example, R. People, "Physics and Applications of $Ge_x$-$Si_{1-x}$/Si Strained-Layer Heterostructures" *IEEE Journal of Quantum Electronics*, Vol. QE-22, No. 9, September 1986. A thin undoped silicon cap layer of approximately 70 Å thickness is grown on top of the active layer and is subsequently oxidized for providing the gate oxide. The high quality, thin gate oxide layer can be grown by rapid thermal oxidation. The active layer of doped polysilicon 24 and 26 is then formed on the oxidized cap layer. The structure employs modulation doping to reduce impurity scattering. The doping extends up to the spacer boundary of the buffer layer.

By introducing the short period silicon-germanium superlattice for the active channel, alloy scattering is eliminated. Also, due to the strained thin germanium layers, very high mobility can be achieved. For example, a bulk germanium has 2.5 and 4.2 times higher mobilities for electrons and holes, respectively, at 300° K. compared to those for bulk silicon. With the compressive strain, the mobility can be increased further.

Figure 2A:
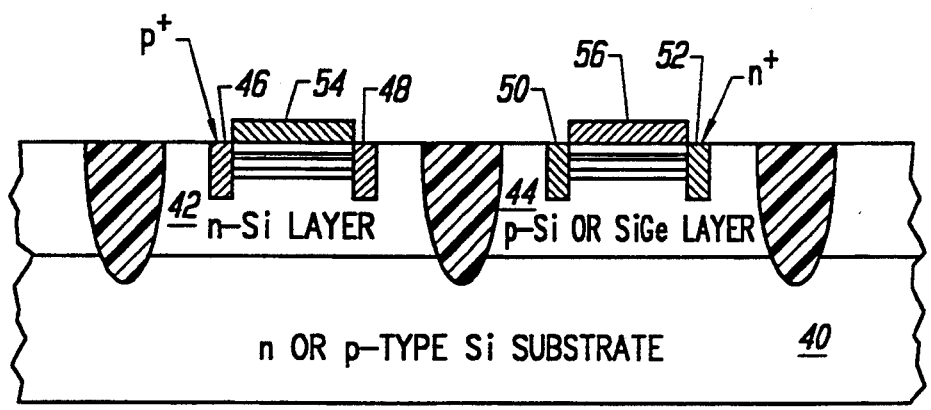
FIG. 2A is a section view of a superlattice CMOD structure in accordance with another embodiment of the invention.

The short period silicon-germanium superlattices can be used in the channels of MODFETS and HEMT structures using modulation doping. FIG. 2A is a cross section of a superlattice CMOD device is in accordance with another embodiment of the invention. The complementary CMOD is fabricated on an n-doped or p-doped silicon substrate 40 with the p-channel device fabricated in an n-doped Si or SiGe epitaxial layer 42 and the n-channel device is fabricated in a p-doped silicon or silicon-germanium layer 44. Again, the p-channel device has p+ doped source and drain regions 46 and 48, and the n-channel device has n+ doped source and drain regions 50, 52. In the CMOD structure, Schottky gate contacts 54 and 56 are formed over the channel regions between the source and drain of the transistors. Oxide isolation is provided for each device.

Figure 2B:
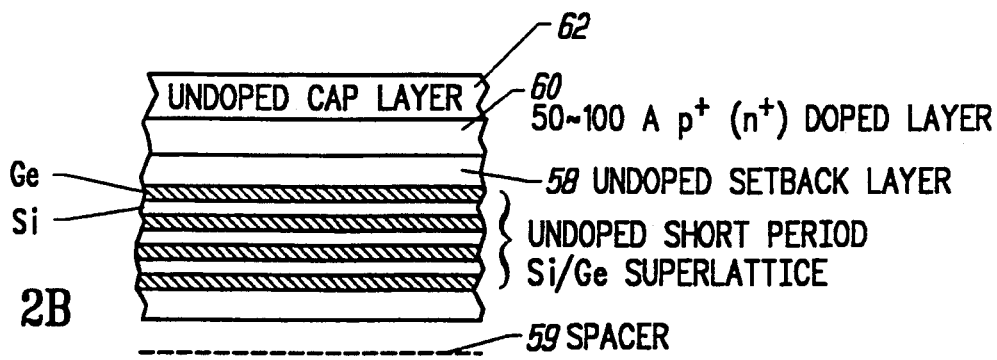
FIG. 2B is an enlarged cross section of the channel regions of the transistors in the structure.

Again, the channel regions comprise alternating layers of pure silicon and pure germanium as illustrated in the cross section view of FIG. 2B. An undoped setback layer 58 of silicon is epitaxially grown on the short period silicon-germanium superlattice structure to enhance carrier mobility. Similarly, the spacer layer 59 is provided before the growth of the Si/Ge superlattice to provide the modulation doping. An n+ or p+ doped epitaxial silicon or Ge/Si layer 60 of 50–100 Å thickness is formed on the setback layer 58 to provide channel carriers. An undoped silicon cap layer 62 of silicon is then formed on the doped layer 60 with the Schottky gate contacting the cap layer 62.

In this case, a two-dimensional electron gas is formed in the silicon-germanium superlattice region. The choice of species (silicon or silicon-germanium) for the cap layer, the doped layer, and the setback layer for the n-channel device depends on the type of band structure controlled by the strain. In this structure, the cap and doped layers will be similar to the buffer layer to provide a potential barrier.

Figure 3A:
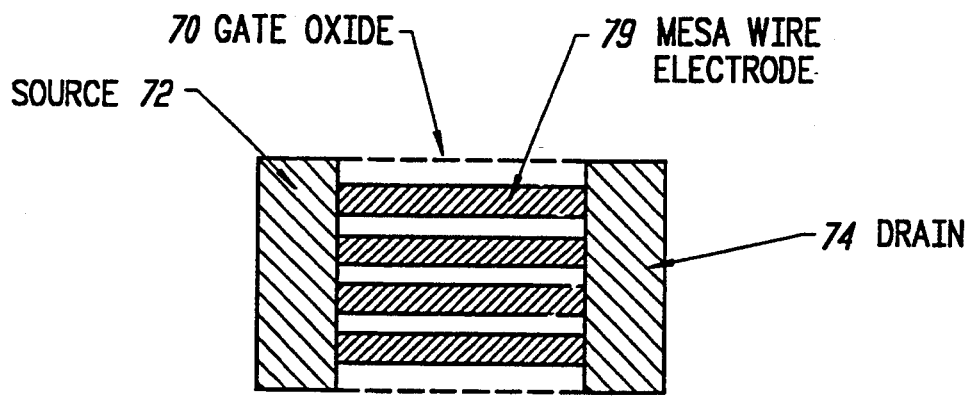
FIG. 3A is a top view of a quantum wire transistor in accordance with another embodiment of the invention.
Figure 3B:
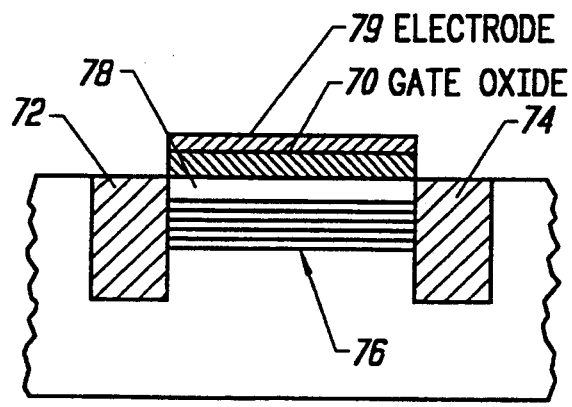
FIG. 3B is a section view of the gate and channel region of the transistor.

FIG. 3A is a top view of a short period silicon-germanium superlattice device which can be employed in quantum wire transistor applications. The material combination used may be those shown in FIG. 1A and 2A. The gate oxide 70 is shown in FIG. 3A to provide gate isolation as an example. Other combinations may be those illustrated in FIG. 2A and the superlattice may be replaced with a simple quantum well structure as those described in U.S. Pat. No. 5,155,571. In this device, mesa wires 79 function as the gate electrode between the source 72 and drain 74 of the transistor. The mesa columns are fabricated in doped polysilicon or doped germanium-silicon or metal electrode with a width on the order of 10–100 nm using electron beam, ion beam, or x-ray or other fine-line lithographic techniques along with plasma or reactive ion beam etching. The etching may be stopped at the gate definition of the gate electrode or it may be continued to go through the superlattice and to the some depth of buffer layers. The resulting quantum wires 70 provide a quantum confinement in the growth plane of the short period silicon-germanium superlattices in the channel region as illustrated at 76 in the section view of FIG. 3B. Again, a thin, undoped silicon cap layer 78 is provided on the superlattice structure and is oxidized to provide the gate oxide 79.

Since the typical periodicity of silicon-germanium layers is within a few monolayers, there is quantum confinement in the growth direction, and the quantum wires provide quantum confinement in the growth plane. Thus the quantum wires limit the momentum space and restrict scattering. Many wires can be formed between the source and drain regions to increase transconductance. In this manner, the superlattice MOSFETs and CMOSFETs as well as CMOD described above can be implemented to quantum wire forms with improved mobility and thus improved performance of the transistors. With the wire structures, the gate capacitance will be reduced in comparison with the use of a uniform plane gate structure while with increased conductance due to mobility enhancement. The reduced capacitance can further improve the frequency performance of the transistor.

There have been described several embodiments of field effect transistor structures using undoped or modulation doped short period silicon-germanium superlattice structures in the channel regions to increase carrier mobility by eliminating alloy and phonon scattering. While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A field effect device comprising
   a monocrystalline silicon semiconductor substrate,
   a first epitaxial layer of silicon grown on said substrate and doped with a first conductivity type dopant,
   a plurality of layers of semiconductor material epitaxially grown on said first epitaxial layer, said plurality of layers comprising alternate single layers of silicon and of germanium semiconductor materials, thereby forming a plurality of heterojunctions in a superlattice structure,
   a source and a drain formed in spaced apart regions in said first epitaxial layer with said superlattice structure therebetween, and
   a gate contact formed over said superlattice structure.

2. The field effect device as defined by claim 1 and further including an insulation layer between said gate contact and said superlattice structure.

3. The field effect device as defined by claim 2 and further including a buffer layer of silicon over said superlattice structure, said insulation layer comprising silicon oxide formed on said layer of silicon, said superlattice structure functioning as a conduction channel.

4. The field effect device as defined by claim 3 and further including an undoped spacer layer on which said superlattice structure is formed.

5. The field effect device as defined by claim 5 wherein numbers of atomic layers for silicon and germanium are n and m and the ratio of n to m+n equals alloy concentration of the buffer layer whereby said superlattice has no average strain with respect to said buffer layer.

6. The field effect device as defined by claim 5 wherein thickness of each silicon and germanium layer in said superlattice is not greater than a critical thickness for maintaining a strained heterojunction.

7. The field effect device as defined by claim 5 wherein said first conductivity type is n-type, said source and said drain being doped with p-type dopant.

8. The field effect device as defined by claim 4 wherein said superlattice is undoped.

9. The field effect device as defined by claim 7 wherein said gate contact comprises doped polycrystalline silicon.

10. The field effect device as defined by claim 7 wherein said field effect device is one of two complementary field effect devices.

11. A field effect device comprising
a monocrystalline silicon semiconductor substrate,
a first epitaxial layer of silicon-germanium alloy grown on said substrate and doped with a first conductivity type dopant,
a plurality of layers of semiconductor material epitaxially grown on said first epitaxial layer said plurality of layers comprising alternate single layers of silicon and of germanium semiconductor materials, thereby forming a plurality of heterojunctions in a superlattice structure,
a source and a drain formed in spaced apart regions in said first epitaxial layer with said superlattice structure therebetween, and
a gate contact formed over said superlattice structure.

12. The field effect device as defined by claim 11 and further including an undoped setback layer of silicon epitaxially grown on said superlattice, a doped layer of semiconductor material epitaxially grown on said setback layer, and an undoped cap layer of silicon epitaxially grown on said doped layer.

13. The field effect device as defined by claim 12 wherein thickness of each layer in said superlattice is not greater than a critical thickness for maintaining a strained heterojunction.

14. The field effect device as defined by claim 13 wherein said first conductivity type dopant is p-type, said source and said drain being doped with n-type dopant, and said superlattice structure is undoped.

15. The field effect device as defined by claim 13 wherein said first conductivity type is n-type, said source and said drain being doped p-type.

16. The field effect device as defined by claim 14 wherein said gate contact comprises a Schottky metal contact.

17. The field effect device as defined by claim 16 wherein said field effect device is one of two complementary field effect devices.

18. The field effect device as defined by claim 1 wherein said gate contact comprises a plurality of quantum wires.

19. The field effect device as defined by claim 18 wherein said quantum wires comprise a layer of doped semiconductor material which has been etched to form said quantum wires.

20. The field effect device as defined by claim 19 wherein said layer of doped semiconductor material comprises a germanium-silicon alloy.

* * * * *